US012787222B2

(12) United States Patent
Wong Shun Yin et al.

(10) Patent No.: US 12,787,222 B2
(45) Date of Patent: Nov. 3, 2026

(54) INTELLIGENT LIQUID COOLING OF ELECTRONIC DEVICES BY ACTIVELY CONTROLLED MANIFOLDS

(71) Applicant: Flowserve Pte. Ltd., Singapore (SG)

(72) Inventors: Wendell Wong Shun Yin, Singapore (SG); Neil Havrilla, Coplay, PA (US); Michael Albert Mancuso, Coppell, TX (US)

(73) Assignee: Flowserve Pte. Ltd., Singapore (SG)

( * ) Notice: Subject to any disclaimer, the term of this patent is extended or adjusted under 35 U.S.C. 154(b) by 246 days.

(21) Appl. No.: 18/767,367

(22) Filed: Jul. 9, 2024

(65) Prior Publication Data

US 2026/0020189 A1 Jan. 15, 2026

(51) Int. Cl.
*H05K 7/20* (2006.01)

(52) U.S. Cl.
CPC ..... *H05K 7/20281* (2013.01); *H05K 7/20236* (2013.01); *H05K 7/20263* (2013.01); *H05K 7/20272* (2013.01); *H05K 7/20781* (2013.01)

(58) Field of Classification Search
CPC ........... H05K 7/20236; H05K 7/20263; H05K 7/20272; H05K 7/20781; H05K 7/20281
See application file for complete search history.

(56) References Cited

U.S. PATENT DOCUMENTS 7,724,524 B1 5/2010 Campbell
7,885,070 B2 2/2011 Campbell
9,426,927 B2 8/2016 Shafer
9,918,408 B2 3/2018 Regimbal
10,156,873 B2 12/2018 Shelnutt
(Continued)

FOREIGN PATENT DOCUMENTS

WO 2010149536 A1 12/2010
WO 2019073444 A1 4/2019

OTHER PUBLICATIONS

LiquidCool Solutions "A patented approach to immersion cooling technology" retrieved from the internet <URL: https://liquidcoolsolutions.com/immersion-cooling-technology/> 7 pages.
(Continued)

*Primary Examiner* — Jayprakash N Gandhi
*Assistant Examiner* — Matthew Sinclair Muir
(74) *Attorney, Agent, or Firm* — Maine Cernota & Curran

(57) ABSTRACT

A system configured for cooling electronic devices comprises a pair of opposing, active manifolds that control a flow of cooling liquid through pipes or through an immersion tank past the electronic devices. A controller detects and/or predicts localized hotspots and adjusts flow control devices associated with inlets and outlets of the manifolds to direct proportionately more cooling liquid to the hotspots. The flow control devices can be any combination of variable speed pumps and/or adjustable valves, vents, and/or baffles. Manifolds can be placed on two opposing sides of the devices, on four opposing sides, and/or above and/or below the devices. Temperatures proximate the devices can be measured by separate sensors and/or sensors integral to components of the electronic devices. Hotspots can be predicted by monitoring current flows, power flows, and/or voltages of the electronic devices, and/or inferred from network activity and/or from a workload queue.

18 Claims, 10 Drawing Sheets

(56) References Cited

U.S. PATENT DOCUMENTS

| | | | | |
|---|---|---|---|---|
| 10,257,963 | B2 | 4/2019 | Ozyalcin | |
| 10,271,456 | B2 | 4/2019 | Tufty | |
| 10,390,458 | B2 | 8/2019 | Tufty | |
| 10,674,637 | B2 | 6/2020 | Ishinabe | |
| 11,683,913 | B2 * | 6/2023 | Zhang | G06F 1/20 361/679.53 |
| 11,778,790 | B2 | 10/2023 | Edmunds | |
| 2016/0118317 | A1 * | 4/2016 | Shedd | F25B 23/006 257/712 |
| 2016/0120058 | A1 | 4/2016 | Shedd | |
| 2017/0234623 | A1 | 8/2017 | Fried | |
| 2019/0223324 | A1 | 7/2019 | Le | |
| 2022/0066899 | A1 * | 3/2022 | Sloat | G06F 12/0868 |
| 2022/0136909 | A1 * | 5/2022 | Kim | G01K 7/425 702/136 |
| 2022/0151114 | A1 * | 5/2022 | Heydari | H05K 7/20836 |
| 2023/0156960 | A1 * | 5/2023 | Ramakrishnan | H05K 7/20809 361/679.53 |
| 2023/0180444 | A1 | 6/2023 | Heydari | |
| 2023/0217625 | A1 * | 7/2023 | Gao | H05K 7/20236 |
| 2024/0138118 | A1 * | 4/2024 | Shelnutt | F25B 23/00 |
| 2024/0276680 | A1 * | 8/2024 | L'Ecuyer | H05K 7/20236 |
| 2025/0107036 | A1 * | 3/2025 | Lee | H05K 7/20236 |
| 2025/0234485 | A1 * | 7/2025 | Cheng | H05K 7/20272 |
| 2025/0237623 | A1 * | 7/2025 | Chen | G06F 1/206 |
| 2025/0311172 | A1 * | 10/2025 | Kufahl | H05K 7/20781 |

OTHER PUBLICATIONS

International Search Report & Written Opinion for International Application No. PCT/US2025/036195 md Nov. 4, 2025, 15 pages.

* cited by examiner

INTELLIGENT LIQUID COOLING OF ELECTRONIC DEVICES BY ACTIVELY CONTROLLED MANIFOLDS

FIELD OF THE INVENTION

The invention relates to cooling of electronic devices, and more particularly to liquid cooling of electronic devices.

BACKGROUND OF THE INVENTION

Many electronic devices, including most computers, comprise some sort of cooling mechanism designed to moderate the temperatures of the integrated circuits (ICs) included in the device, as well as the overall temperature within the device housing. For example, most laptop and desktop computers include at least one fan that circulates ambient air throughout the housing interior. In addition, circuits with high power consumption, such as central processing units (CPUs), often include dedicated fans to ensure that they do not overheat.

This "forced air convection" approach is effective for many individual electronic devices having housings that are surrounded by ambient air. However, forced air convection may be insufficient for cooling large "clusters" or "arrays" of components or devices that are closely spaced together.

Instead, with reference to the top view of FIG. 1A, for high density arrays of electronic devices 100, such as are generally present in so-called data centers, "server farms" and "super-computers," a piped cooling liquid, such as water, oil, water mixed with ethylene glycol, or some other cooling liquid, is sometimes used to cool the electronic devices 100. According to this approach, a Coolant Distribution Unit (CDU) comprises inlet 114 and outlet 116 manifolds which circulate the cooling liquid through pipes 118, such as copper pipes, which extend between and/or through the device cabinets 120 in thermal communication with the electronic devices 100, causing the cooling liquid to absorb heat from the devices 100, and to conduct the heat to an external heat dissipation apparatus 108, 110.

The pipes 118 may include fins (not shown) which increase ambient heat absorption into the pipes. In some applications, the components that generate the most heat, such as CPUs, are placed in direct thermal contact with the pipes 118, so that they are cooled with the greater efficiency. In some piped cooling liquid embodiments, the device cabinet 120 of FIG. 1A is omitted, and the cooling liquid pipes are directed to or through the housings of the electronic devices 100, or directly to electronic components of the electronic devices 100.

With reference to the top view of FIG. 1B, another approach is to locate the electronic devices 100 in a liquid-tight immersion tank 102, and to immerse the electronic devices 100 in a dielectric liquid 104. This approach places each electronic component of each of the electronic devices 100 in direct physical and thermal contact with the cooling liquid 104.

FIGS. 1A and 1B illustrate a plurality of electronic devices 100 enclosed in separate housings and arranged within a device cabinet 120 or immersion tank 102 in a horizontal column. It will be noted, however, that embodiments of the present invention are also applicable to electronic devices that are not arranged in rows and/or columns, as well as to single electronic devices having a plurality of electronic components, for example a large "motherboard" comprising a plurality of integrated circuits, whether or not each electronic device is enclosed within a separate housing.

It will also be noted that, unless otherwise stated or required by context, terms such as "electronic device" and "electronic component" are used generically and interchangeably herein to refer to any electronic element of a system that requires cooling. It will be further noted that terms such as "array" and "device array" are used herein generically to refer to any group of electronic devices and/or components that are to be cooled by the present invention, regardless of how they are physically arranged.

Typically, as shown in FIGS. 1A and 1B, a pump 106 is used to circulate the cooling liquid 104 through the pipes 118 or the immersion tank 102, and then through a heat dissipation apparatus, such as the heat exchanger 108 and cooling tower 110 that are shown in the figures. Often, the cooling liquid is circulated through external pipes 112 between the device array 100, the pump 106, and the heat dissipation apparatus 108, 110.

It will be understood, that the heat exchangers 108 and cooling towers 110 that are included in the present drawings are intended to generically represent any external heat dissipation apparatus, unless otherwise stated or required by context, and are not meant to limit the invention, or the prior art, to a specific heat dissipation apparatus design. Similarly, it will be understood that the term "server" is used generically herein to refer to any electronic device that requires cooling, whether or not the electronic device is within a housing, and whether or not the device is a network server, unless otherwise required by context.

As is noted above, the top views of FIGS. 1A and 1B illustrate applications in which individual "servers" or other electronic devices 100 are arranged in a horizontal, "longitudinal" column from bottom to top in the figures. In similar applications, the electronic devices 100 are arranged as a grid of devices in perpendicular horizontal rows and columns. According to this approach, each "server" 100 in FIGS. 1A and 1B would be replaced by a row, or "bank," of individual electronic device housings arranged in a horizontal row from left to right. In still other applications, a three-dimensional "matrix" of electronic devices 100 extend horizontally in rows and columns, and vertically in "tiers."

In the examples of FIGS. 1A and 1B, the cooling liquid is uniformly distributed among all of the electronic devices 100 by the inlet 114 and outlet 116 manifolds. This approach essentially assumes that each of the electronic devices 100 will have substantially the same heat output. However, in general, the electronic devices 100 may not all be identical to each other. And even if they are identical electronically, the heat that is generated by each of the electronic devices 100 may vary according to the workload that is placed upon it. This can lead to temperature variations, and to "hotspots," within the array of electronic devices 100. In such cases, if insufficient cooling is applied to the hotspots, the electronic devices 100 in the hotspots will consume excess power and operate less efficiently.

If the locations of the hotspots do not vary with time, it may be possible to cool them by manually configuring the manifolds 114, 116 to direct more of the cooling liquid flow to the hotspot(s). However, if the hotspots are transitory, for example due to shifting workloads among the servers, then it may be necessary to compensate for hotspots by increasing the overall flow of the cooling liquid 104 through the device cabinet 120 or immersion tank 102, thereby providing the required amount of cooling to the hotspots, while providing an excess of cooling to other regions of the device cabinet 120 or immersion tank 102. While effective, this approach can be wasteful of energy, and can require an expensive "overdesign" of the cooling system, whereby the total cooling capacity significantly exceeds the total amount of heat that will ever be generated within the device array. Also, when the circulation of the cooling liquid is increased until the hotspot(s) is/are sufficiently cooled, thereby applying more cooling to other regions than is needed, the temperature of the effluent cooling liquid from the device array will be reduced, thereby decreasing the efficiency of the heat dissipation apparatus 108, 110.

What is needed, therefore, is an electronic device liquid cooling system that can provide adequate liquid cooling to transitory electronic device hotspots, while reducing the required cooling capacity of the overall system and maintaining efficient operation of the heat dissipation apparatus.

SUMMARY OF THE INVENTION

The present invention is an electronic device liquid cooling system that can provide adequate liquid cooling to transitory electronic device hotspots, for example in a data center, a "server farm," or a "super-computer," while reducing the required cooling capacity of the overall system and maintaining efficient operation of the heat dissipation apparatus.

These goals are accomplished by replacing prior art "passive" manifolds 114, 116, which direct cooling liquid through an array of electronic devices 100 in a fixed flow pattern, as discussed above and shown in FIGS. 1A and 1B, with "active" manifolds that can be directed by a controller to vary the flow pattern of the cooling liquid through the cooling pipes or immersion tank, thereby redirecting cooling liquid, as needed, to increase the cooling of hotspots without applying excessive cooing to other regions. In embodiments, the flow pattern of the cooling liquid can be changed as rapidly as every minute, or even every second, if necessary.

It will be understood that the term "hotspot," as used herein, refers to any region in a device array that requires, or is predicted to require, additional cooling, so as to maintain optimal conditions. In some embodiments, any region within a device array that is, or will be, generating more than an average amount of heat per square cm is considered to be a hotspot. In embodiments, the active manifolds of the disclosed invention are adjusted to compensate for changes in the heat being generated by the various electronic devices, and thereby to provide a more uniform temperature within the device array, while control of the overall flow rate of the cooling liquid through the device array controls the average temperature.

In various embodiments, at least one pair of active manifolds is provided, being an inlet manifold and a corresponding outlet manifold, arranged on horizontally opposing sides of the electronic device cabinet or immersion tank. In other embodiments, active manifolds are placed on all four sides of the cabinet or immersion tank. Some embodiments include at least one active manifold located on the bottom of the cabinet or immersion tank.

In various embodiments, the adjustment of the active manifolds is reactive, predictive, or both. According to measured and/or predicted variations in temperature throughout the components and/or devices, the controller adjusts the overall flow of the cooling liquid through the device array, and also causes the active manifolds to direct proportionally more of the cooling liquid toward the regions of the array that are, or will soon be, generating excessive heat, while directing proportionally less of the cooling liquid toward other regions.

In embodiments where reactive manifold control is implemented, the controller receives temperature measurements from a plurality of locations within the device array. In some of these embodiments, at least one of the temperature measurements is provided by a sensor that is integral to an integrated circuit (IC), such as a central processing unit (CPU), and is configured to report a temperature of the IC. Other embodiments include at least one temperature sensor configured to measure a local temperature of the cooling liquid or ambient air.

Predictive control of the active manifolds, as is implemented in some embodiments, enables the active manifolds to direct additional coolant to locations within the device array where it will be most needed, in advance of any actual changes in temperature, and in some embodiments also in advance of any actual changes in heat generation, thereby minimizing or avoiding temperature fluctuations within the device array, and providing increased IC longevity and improved operational stability. In some embodiments where predictive manifold control is implemented, changes in the heat output of the electronic components are anticipated by monitoring the amount of current that is drawn by at least one of the various components, such as one or more servers or other electronic devices. This approach is predictive, in that an increase in current usage, and a consequent increase in heat dissipation, generally precedes the resultant rise in component temperature.

In other embodiments where predictive manifold control is implemented, local variations in heat generation within the device array are predicted according to anticipated changes in the workloads that each electronic device or component will be subjected to. For example, an anticipated workload can be inferred from network activity, and/or on from an internal server scheduler that queues tasks to be performed by the device array. Both are normally precursors to an incoming request for processing of data that will result in a spike in the activity of a server or other data processing device, and hence a local increase in heat generation.

According to the present invention, each of the active manifolds includes an inlet and a plurality of spaced apart manifold outlets, or an outlet and a plurality of spaced apart manifold inlets, and further includes a plurality of adjustable flow control devices that separately control the flow of cooling liquid into or out from each of the plurality of inlets or outlets. In embodiments, at least one of the active manifolds comprises a plurality of variable speed pumps, such as variable frequency pumps, which are separately controlled by the controller and arranged such that each pump is directed to a separate inlet or outlet. In embodiments, at least one of the pumps is an "intelligent" rotary pump that is configured to maintain a specified flow output even under changing flow impedances, such as might occur if a downstream filter becomes partially blocked. In some of these embodiments, the intelligent pump estimates the liquid flow according to a pre-calibrated relationship between impeller speed and impeller torque, and then adjusts the impeller speed accordingly to provide the specified flow output.

In other embodiments, at least one of the active manifolds comprises a plurality of remotely controlled valves, vents, and/or baffles, which are separately adjusted by the controller and arranged such that each valve, vent, or baffle is directed to a separate inlet or outlet. Depending on the embodiment, the valves, vents, and/or baffles can be electronically adjustable, pneumatically adjustable, hydraulically adjustable, or adjustable by any other means known in the art. In still other embodiments, at least one of the active manifolds includes a combination of variable speed pumps and remotely controlled valves, vents, and/or baffles which, in combination, separately control the flow into or out of each of the plurality of inlets and outlets.

A first general aspect of the present invention is a cooling system configured to cool a plurality of electronic devices. The cooling system includes a controller, an active inlet manifold comprising a plurality of spaced apart manifold outlets through which a cooling liquid can flow into proximity and thermal communication with the electronic devices, and an active outlet manifold comprising a plurality of spaced apart manifold inlets through which the cooling liquid can flow from proximity with the electronic devices into the active outlet manifold.

The active inlet manifold includes a first plurality of remotely adjustable flow control devices that separately control the flow of the cooling liquid through each of the plurality of manifold outlets, and the active outlet manifold includes a second plurality of remotely adjustable flow control devices that separately control the flow of the cooling liquid through each of the plurality of manifold inlets. The controller is configured to detect and/or predict a local heat dissipation increase in a hotspot region of the electronic devices, and adjust the flow control devices of the active manifolds to cause more of the cooling liquid to flow in thermal communication with the hotspot region as compared to other regions proximate the electronic devices.

In some embodiments, the cooling liquid is directed through spaced apart pipes that flow in thermal communication with the electronic devices, while in other embodiments the electronic devices are enclosed within an immersion tank, and the cooling liquid fills and flows through the immersion tank in direct physical contact with the electronic devices.

In any of the above embodiments, at least one of the first and second pluralities of remotely adjustable flow control devices can be a variable speed pump. In some of these embodiments the variable speed pump is an intelligent rotary pump that is configured to maintain a controller specified flow rate of the cooling liquid therethrough.

In any of the above embodiments, at least one of the first and second pluralities of adjustable flow control devices can be a remotely adjustable valve, vent, or baffle.

In any of the above embodiments, at least one of the inlet active manifold and the outlet active manifold can include a variable speed pump and a remotely adjustable valve, vent, or baffle.

In any of the above embodiments, the active inlet manifold can be a first active inlet manifold, the active outlet manifold can be a first active outlet manifold, the first active inlet and outlet manifolds can be arranged on opposing first and second sides of the electronic devices, and configured to direct the cooling liquid in a first horizontal direction past the electronic devices, and the cooling system can further include a second active inlet manifold and a second active outlet manifold, the second active inlet and outlet manifolds being located on opposing third and fourth sides of the electronic devices and configured to direct the cooling liquid in a second horizontal direction past the electronic devices, the second horizontal direction being orthogonal to the first horizontal direction.

Any of the above embodiments can further include at least one of a third active inlet manifold located below the electronic devices and a third active outlet manifold located below the electronic devices.

In any of the above embodiments, the controller can be configured to receive a temperature measurement from a first temperature sensor proximate the electronic devices. In some of these embodiments, the first temperature sensor is integral to a first electronic component of the plurality of electronic devices, and is configured to measure an internal temperature of the first electronic component.

In any of the above embodiments, the controller can be configured to predict the local heat dissipation increase in the hotspot region of the immersion tank in advance of a temperature increase therein. In some of these embodiments, the controller is configured to predict the local heat dissipation increase in the hotspot region of the immersion tank at least in part according to a measurement of an electrical status of a first electronic component of the plurality of electronic devices, the electrical status being at least one of: an amount of current flowing through the first electronic component; an electrical voltage applied to the first electronic component; and an amount of electrical power flowing to the first electronic component. In any of these embodiments, the controller can be configured to predict the local heat dissipation increase in the hotspot region of the immersion tank at least in part according to a workload prediction that is applicable to the first electronic device. In some of these embodiments, the workload prediction is inferred from information regarding network activity, and/or information derived from an internal server scheduler that queues tasks to be performed by the first electronic device.

In any of the above embodiments, the plurality of electronic devices can be arranged in at least one of a plurality of horizontal rows, a plurality of horizontal columns, and a plurality of vertical tiers.

A second general aspect of the present invention is a method of cooling a plurality of electronic devices. The method includes providing a cooling system comprising: a controller; an active inlet manifold comprising a plurality of spaced apart outlets through which a cooling liquid can flow into proximity and thermal communication with the electronic devices; and an active outlet manifold comprising a plurality of spaced apart inlets through which the cooling liquid can flow from proximity with the electronic devices into the active outlet manifold; and the active inlet manifold includes a first plurality of remotely adjustable flow control devices that separately control the flow of the cooling liquid through each of the plurality of outlets, and the active outlet manifold includes a second plurality of remotely adjustable flow control devices that separately control the flow of the cooling liquid through each of the plurality of inlets.

The method includes at least one of detecting and predicting a local heat dissipation increase in a hotspot region of the electronic devices, and adjusting by the controller of the flow control devices of the active manifolds to cause more of the cooling liquid to flow in thermal communication with the hotspot region as compared to other regions proximate the electronic devices.

In embodiments, predicting the local heat dissipation increase in the hotspot region comprises receiving a measurement of an electrical status of a first electronic component of the plurality of electronic devices, the electrical status being at least one of: an amount of current flowing through the first electronic component; an electrical voltage applied to the first electronic component; and an amount of electrical power flowing to the first electronic component.

Any of the above embodiments, predicting the local temperature increase in the hotspot region of the immersion tank can include receiving a workload prediction applicable to a first electronic component of the plurality of electronic devices. And in some of these embodiments, receiving the workload prediction comprises inferring an anticipated workload applicable to the first electronic component from information regarding network activity, and/or information derived from an internal server scheduler that queues tasks to be performed by the electronic devices.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1A:
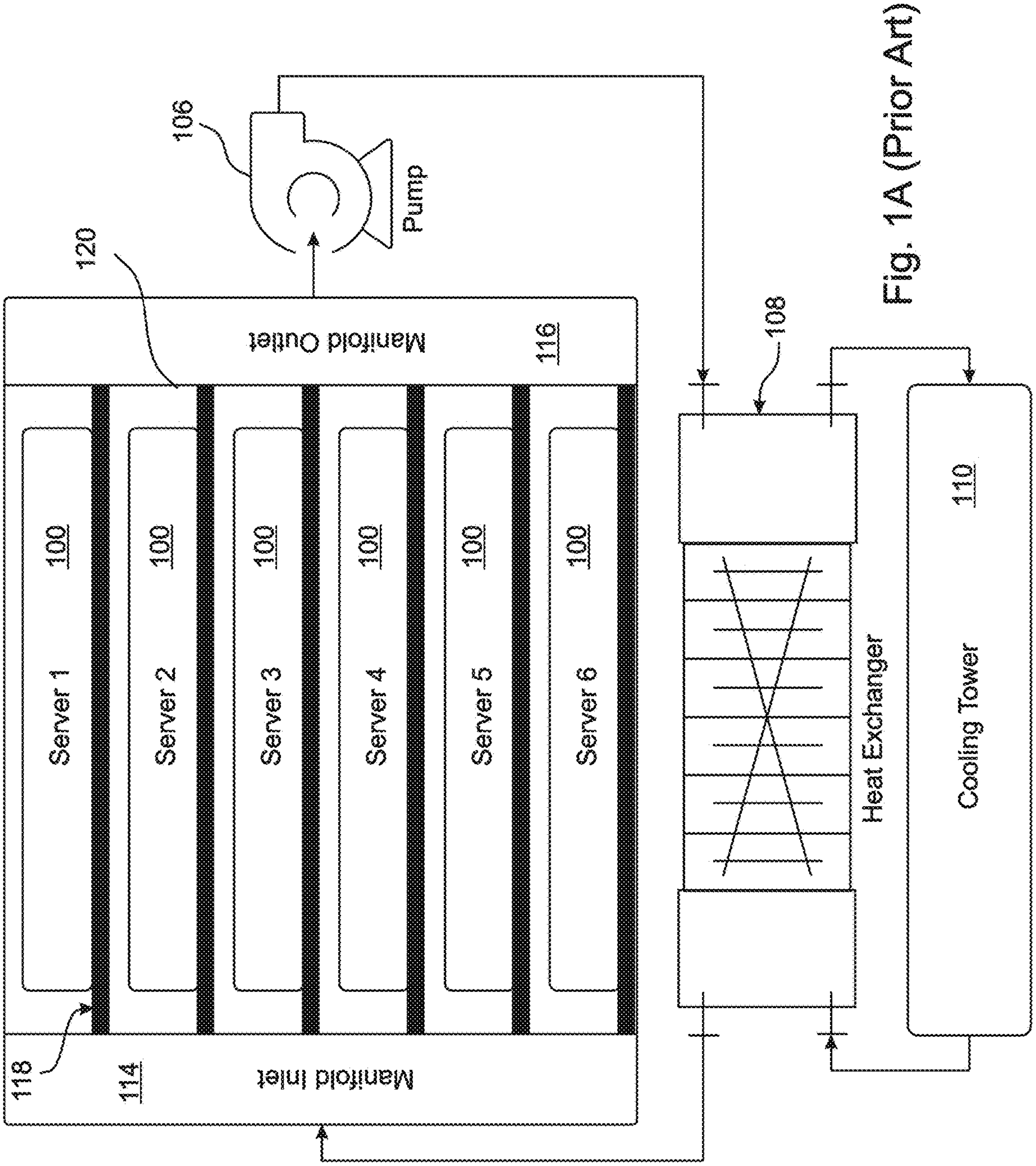
Fig. 1A (Prior Art)
FIG. 1A is top view of a piped cooling liquid system of the prior art.
Figure 1B:
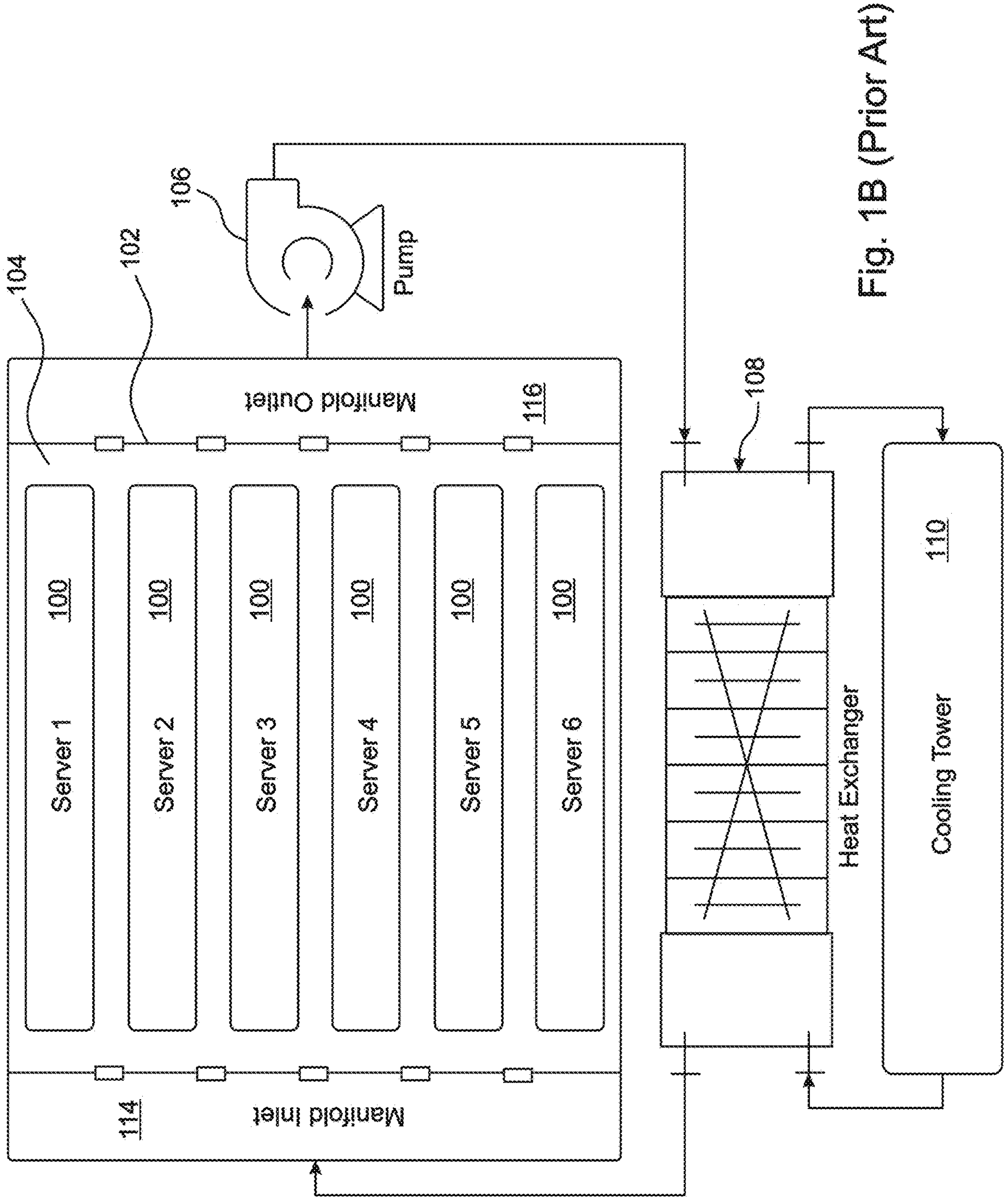
Fig. 1B (Prior Art)
FIG. 1B is top view of a liquid immersion cooling system of the prior art.

The present invention is an electronic device liquid cooling system that can provide adequate liquid cooling to hotspots in an array of electronic devices, for example in a data center, a "server farm," or a "super-computer," while reducing the required cooling capacity of the overall system and maintaining efficient operation of the heat dissipation apparatus.

With reference to FIGS. 1A, 1B, 2A, and 2B these goals are accomplished by replacing the "passive" inlet 114 and outlet 116 manifolds of the prior art, which direct cooling liquid through the device array in a fixed or manually adjusted flow pattern, with "active" inlet 200 and outlet 202 manifolds that can be remotely controlled and adjusted via wired or wireless interconnection 208 by a controller 204 to vary the flow pattern of the cooling liquid, thereby redirecting cooling liquid 104, as needed, to increase the cooling of hotspots without applying excessive cooing to other regions within the device array. In embodiments, the cooling flow pattern can be adjusted by the controller every minute, or even every second, as needed.

It will be understood that the term "hotspot," as used herein, refers to any region within the device array that requires, or is predicted to require, additional cooling, so as to maintain optimal conditions. In some embodiments, any region within the device array that is generating, or is expected to generate, heat that is above an average heat generation of the devices within the device array is considered to be a hotspot. In embodiments, the active manifolds 200, 202 of the disclosed invention are adjusted to compensate for actual and/or anticipated changes in the temperature and/or the heat being generated in a local region within the device array, and thereby to provide a more uniform temperature within the device array, while adjustment of the overall flow rate of the cooling liquid controls the average temperature within the device array.

In various embodiments, the adjustments to the active manifolds 200, 202 are reactive, predictive, or both. According to measured and/or predicted variations in heat generation within the device array, the controller 204 adjusts the overall flow of the cooling liquid, and also causes the active manifolds 200, 202 to direct proportionally more of the cooling liquid toward the regions that are, or will soon be, generating excessive heat, while directing proportionally less of the cooling liquid toward other regions within the device array.

In embodiments where reactive manifold control is implemented, the controller 204 receives temperature measurements 206 from a plurality of locations within the device array. In some of these embodiments, at least one of the temperature measurements is provided by a sensor that is integral to an integrated circuit (IC), such as a central processing unit (CPU), and is configured to report a temperature of the IC. Other embodiments include at least one temperature sensor configured to measure a local temperature of the device array. According to measured temperature differences, the controller 204 adjusts the overall flow of the cooling liquid through the device array, and also causes the active manifolds 200, 202 to direct proportionally more of the cooling liquid 104 toward hotter regions, and less of the cooling liquid 104 toward the cooler regions.

In embodiments where predictive control of the active manifolds is implemented, the controller 204 is able to cause the active manifolds 200, 202 to direct additional coolant to locations within the device array where it will be most needed in advance of actual changes in temperature, thereby minimizing or avoiding temperature fluctuations within the device array, and providing increased IC longevity and improved operational stability. In some embodiments where predictive manifold control is implemented, changes in the temperatures of the electronic components 100 are anticipated by monitoring the amount of current that is drawn by at least one of the components 100, such as one or more servers 100 or other electronic devices. Based on a known or measured voltage that is applied to the component 100, the power consumption of the component 100 can be determined. This approach is predictive, in that an increase in current usage, and a consequent increase in heat dissipation, generally precedes the resultant rise in component temperature.

In other embodiments where predictive manifold control is implemented, local variations in temperature within the device array are predicted according to anticipated changes in the workloads that each device or component 100 will be subjected to. For example, an anticipated workload can be inferred from network activity, and/or on from an internal server scheduler that queues tasks for the electronic devices 100. Both are normally precursors to an incoming request for processing of data that will result in a spike in the activity of a server or other data processing device 100, and hence a local increase in heat generation.

According to the present invention, each of the active manifolds 200, 202 is an inlet manifold 200, which includes an inlet 218 and a plurality of spaced apart active manifold outlets 210, or an outlet manifold 202, which includes an outlet 220 and a plurality of spaced apart manifold inlets 212. In the piped liquid cooling system of FIG. 2A, the manifold outlets 210 and inlets 212 connect to liquid cooling pipes 118 that convey the cooling liquid through the array of electronic devices 100. In the liquid immersion cooling system of FIG. 2B, the active manifold outlets 210 connect to inlet openings 228 of the immersion tank 102, and the active manifold inlets 212 connect to outlet openings 230 of the immersion tank 102.

Each active manifold 200, 202 further includes a plurality of-remotely controlled adjustable flow control devices 214, 216 that separately control the flow of the cooling liquid 104 into or out of each of the plurality of active manifold outlets 210 or inlets 212.

Figure 2A:
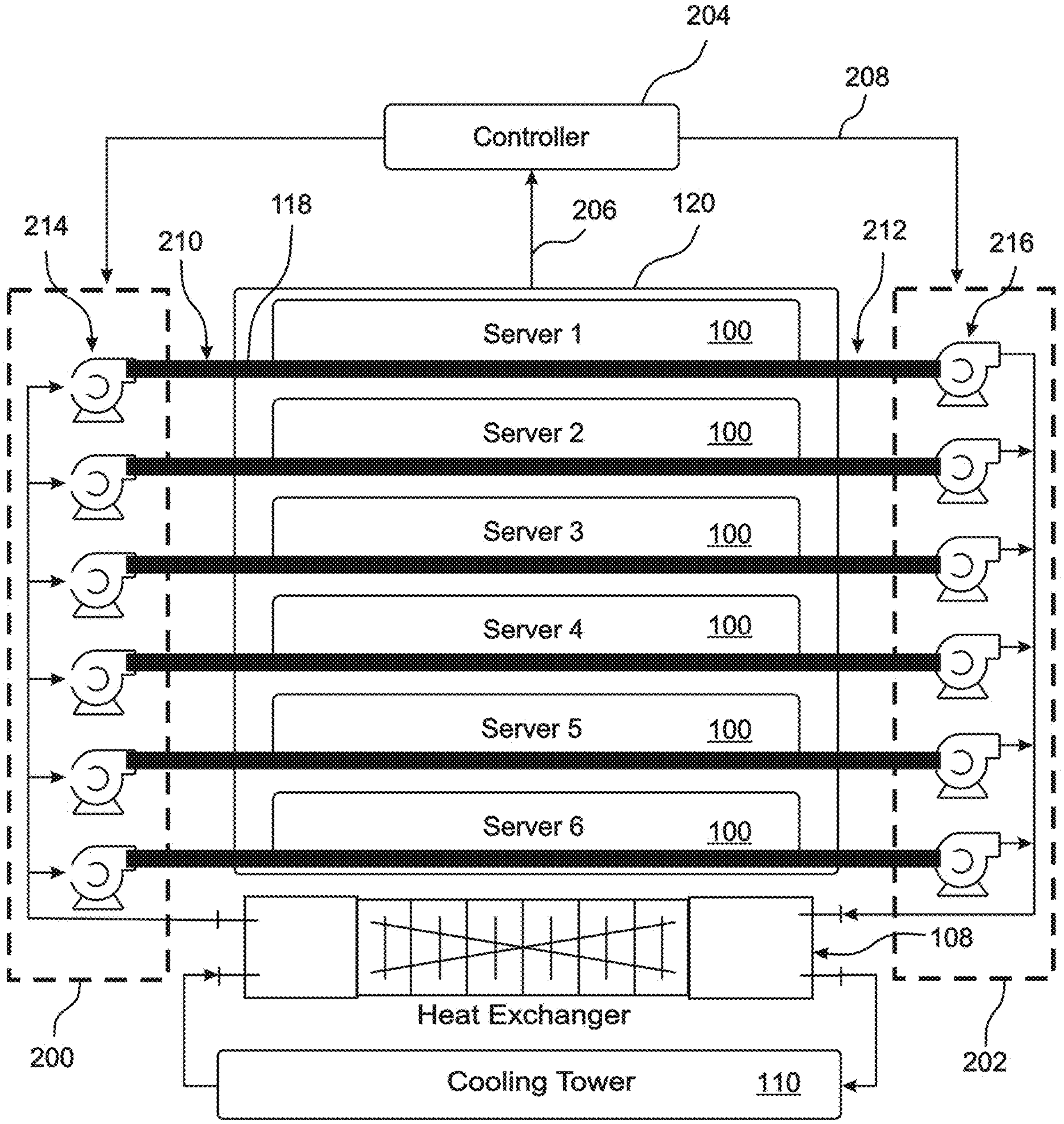
FIG. 2A is a top view of a piped liquid cooling system in an embodiment of the present invention in which the flow control devices of the active manifolds are variable speed pumps.
Figure 2B:
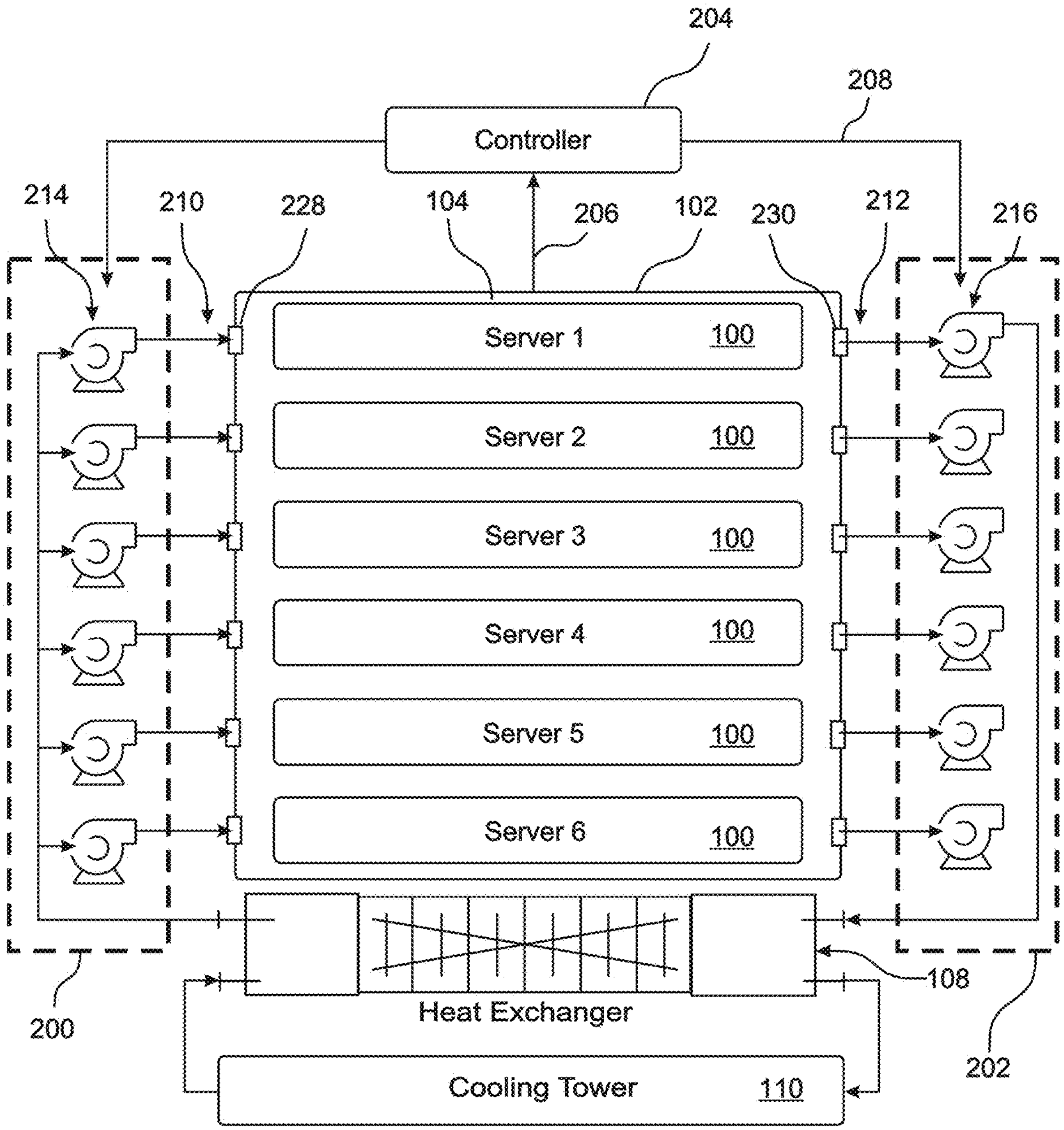
FIG. 2B is a top view of a liquid immersion cooling system in an embodiment of the present invention in which the flow control devices of the active manifolds are variable speed pumps.

In the embodiments of FIGS. 2A and 2B, each of the active manifolds 200, 202 comprises a plurality of variable speed pumps 214, 216, such as variable frequency pumps, which are separately controlled by the controller 204 and arranged such that each pump 214, 216 is directed to a separate active manifold outlet 210 or inlet 212. In embodiments, at least one of the pumps 214, 216 is an "intelligent" rotary pump that is configured to maintain a specified flow output even under changing flow impedances, such as might occur if a downstream filter becomes partially blocked. In some of these embodiments, the intelligent pump estimates the liquid flow according to a pre-calibrated relationship between impeller speed and impeller torque, and then adjusts the impeller speed accordingly to provide the specified flow output By actively controlling the speeds of the pumps 214, 216, the illustrated embodiments mitigate and/or prevent the occurrence of hotspots within the array of electronic devices 100. As an example, if, at a certain time, the "uppermost" server 100 in the device array is generating more heat than the other servers 100, or is expected to do so, the controller 204 adjusts the "uppermost" pumps 214, 216 to operate at higher speeds compared to the other pumps 214, 216. Note that the term "uppermost" is used herein to refer to an uppermost location in the figure. Because FIGS. 2A and 2B are top views, the "uppermost" and "lowermost" regions of the device arrays in FIGS. 2A and 2B are actually horizontally opposed side regions of the cabinet 120 or immersion tank 102 that contains the array of electronic devices 100, and not a vertical top or bottom of the cabinet 120 or immersion tank 102.

Figure 2C:
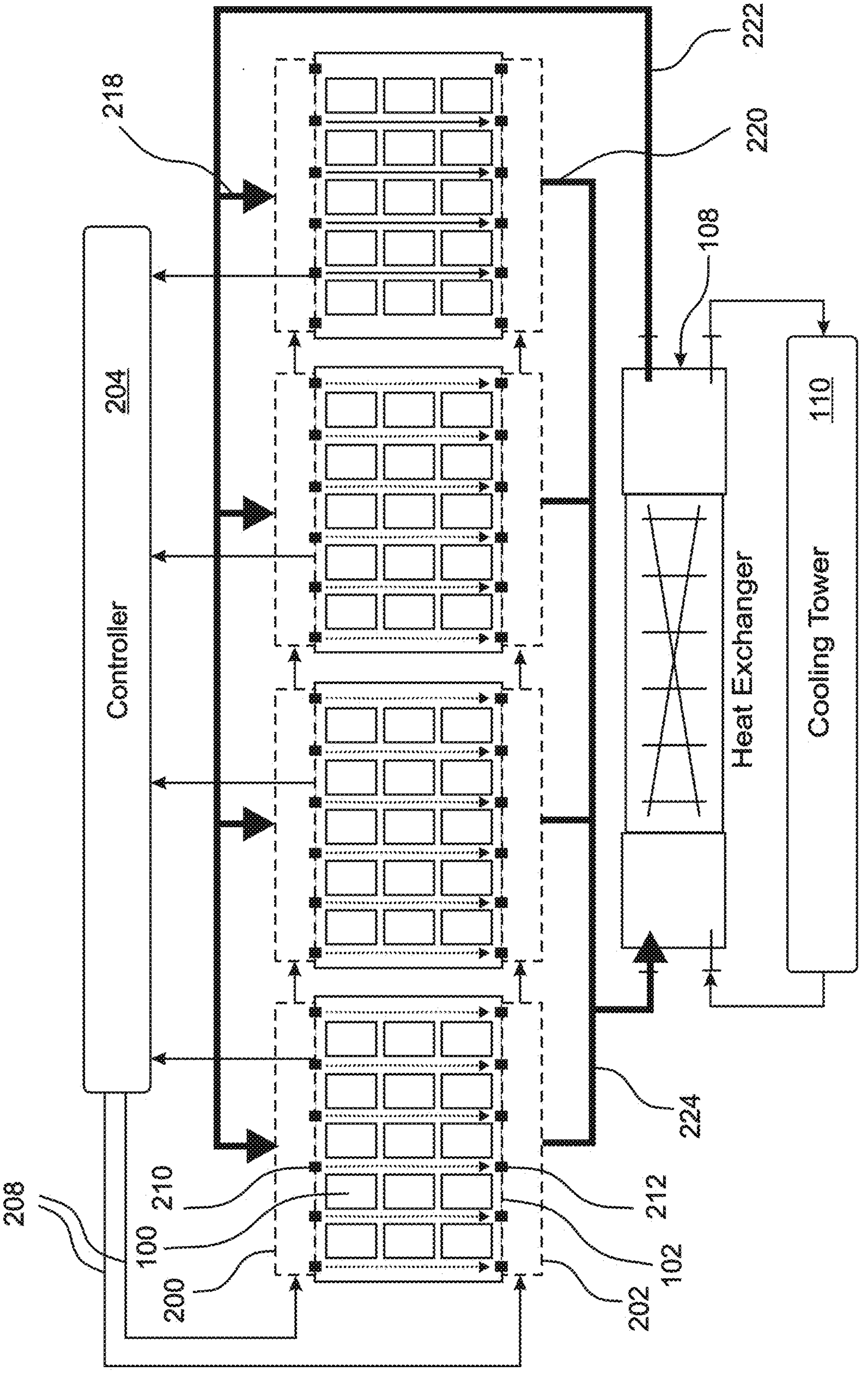
FIG. 2C is a top view of an embodiment of the present invention that includes four cooling liquid immersion tanks arranged side-by-side.

The embodiments of FIGS. 2A and 2B includes only one pair of active inlet 200 and outlet 202 manifolds located on opposite sides of the cabinet 120 or immersion tank 102. This arrangement can be desirable, due to its simplicity and to minimize cost. Also, as illustrated in FIG. 2C, this approach can be preferable in embodiments where four cabinets 120 or immersion tanks 102 are arranged side-by-side in a row. It can be seen that, in the embodiment of FIG. 2C, in which a plurality of immersion cooling tanks 102 are implemented, placement of the active manifolds 200, 202 along only one pair of opposing sides of each immersion tank 102 is advantageous because it allows the immersion tanks 102 to be placed close together side-by-side.

The inlet 222 and outlet 224 external pipes that deliver cooling liquid to the inlets 218 of the inlet active manifolds 200 and withdraw cooling liquid from the outlets 220 of the outlet active manifolds 202 are also visible in FIG. 2C. It can also be seen that, in the embodiment of FIG. 2C, each immersion tank 102 contains 15 electronic devices 100 arranged as an array of three horizontal rows and five horizontal columns.

Figure 3:
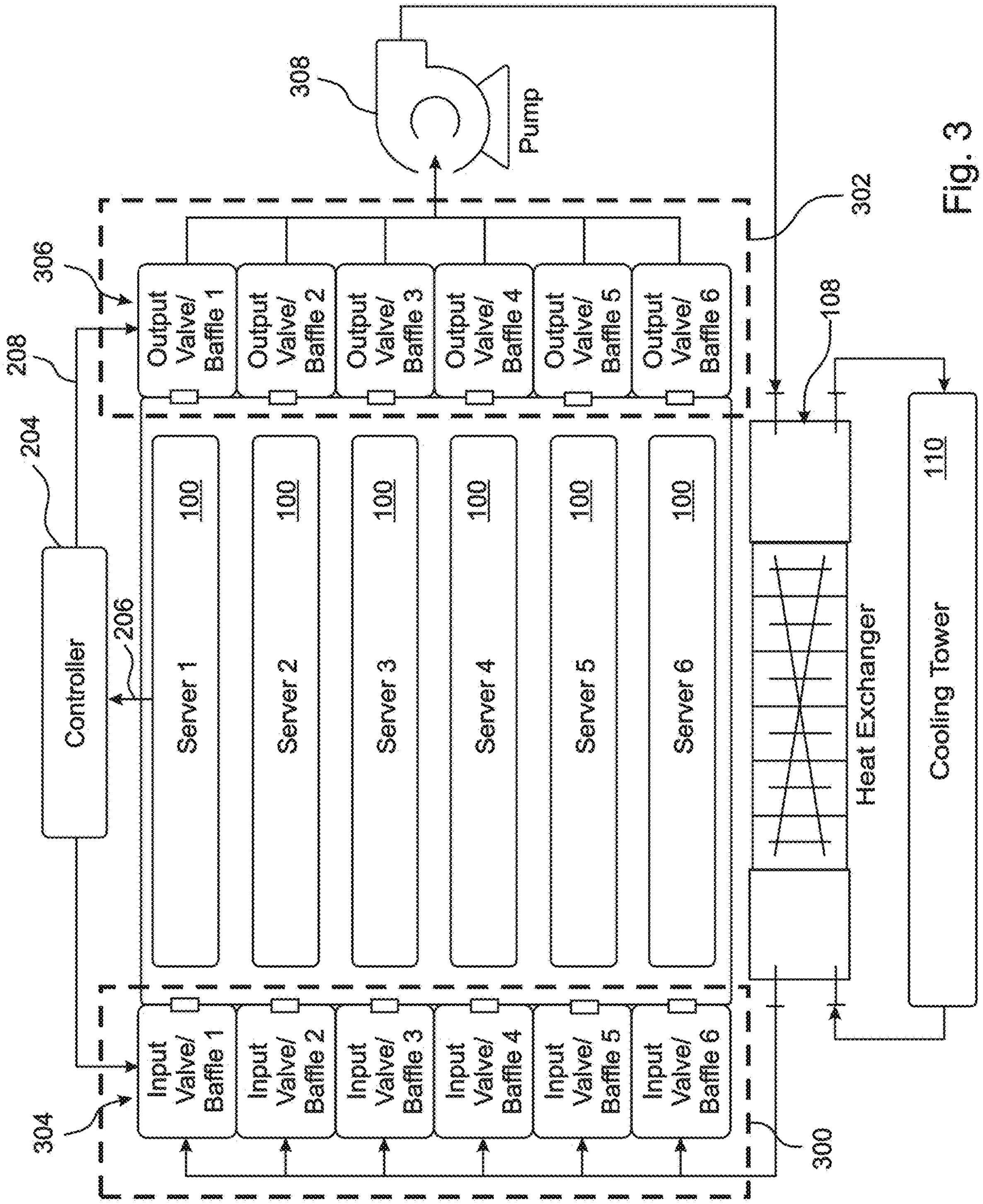
FIG. 3 is a top view of an embodiment of the present invention in which the flow control devices of the active manifolds are variable valves, vents, and/or baffles.

With reference to FIG. 3, in other embodiments at least one of the active manifolds 300, 302 comprises a plurality of adjustable valves, vents, or baffles 304, 306, which are separately adjusted by the controller 204 and arranged such that each valve, vent, or baffle 304, 306 is directed to a separate active manifold outlet 210 or inlet 212. In the illustrated embodiment, the cooling liquid is circulated through a liquid immersion tank 102 by a single, external pump 308, which controls the overall flow rate of the cooling liquid, and hence the average temperature within the immersion tank 102, while the valves, vents, and/or baffles 304, 306 control the distribution of the cooling liquid flow within the immersion tank 102. Similar embodiments employ remotely adjustable valves, vents, or baffles 304, 306 to direct cooling liquid through cooling pipes 118. Depending on the embodiment, the valves, vents, and/or baffles 304, 306 can be electronically adjustable, pneumatically adjustable, hydraulically adjustable, or adjustable by any other means known in the art.

Figure 4:
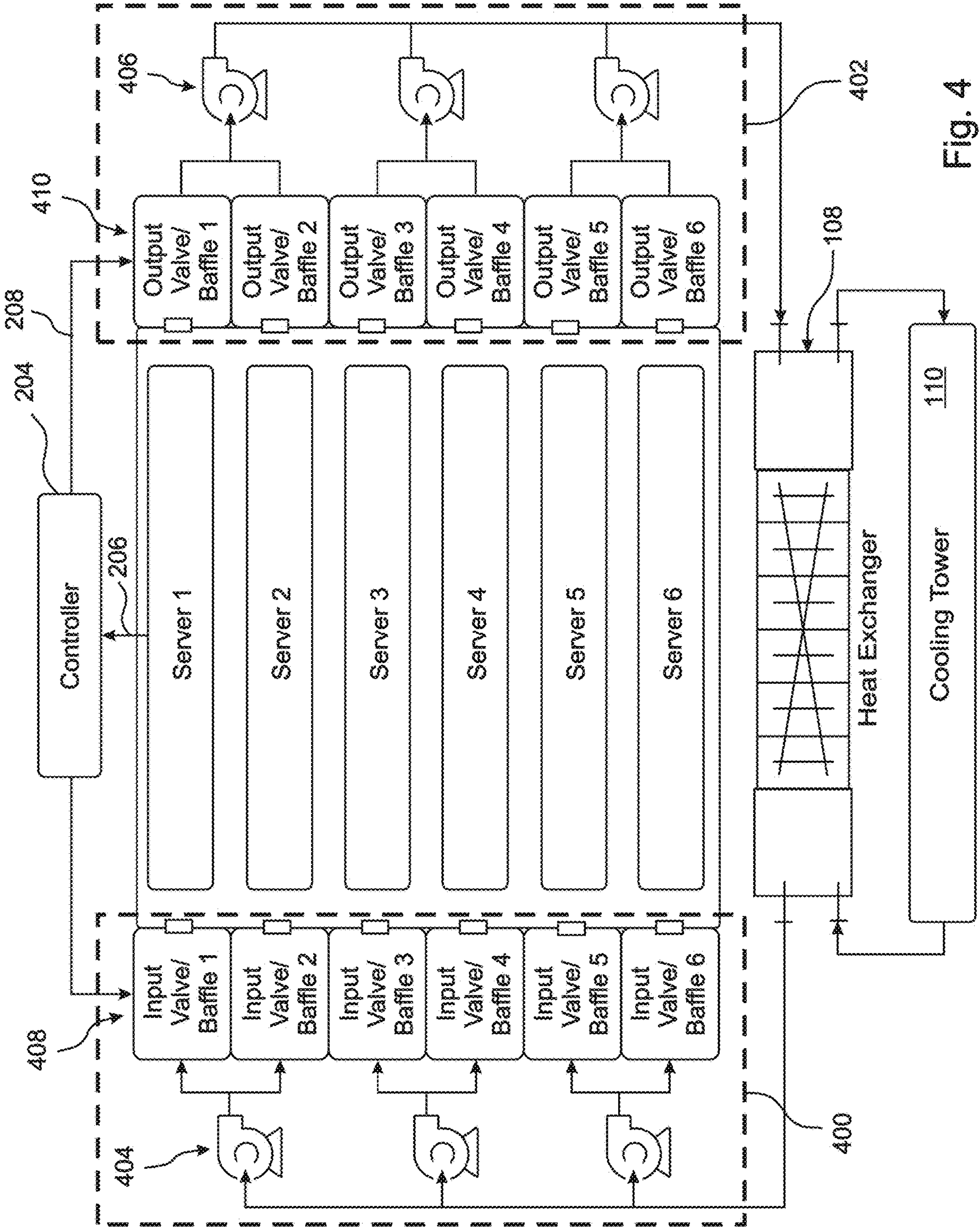
FIG. 4 is a top view of an embodiment of the present invention in which the flow control devices of the active manifolds are a combination of variable speed pumps with variable valves, vents, and/or baffles.

With reference to FIG. 4, in still other embodiments at least one of the active manifolds 400, 402 includes a combination of variable speed pumps 404, 406 with associated valves, vents, and/or baffles 408, 410 which, in combination, separately control the flow into and out of each of the active manifold outlets 210 and inlets 212. FIG. 4 illustrates this approach for a liquid immersion cooling embodiment. Similar embodiments employ a combination of variable speed pumps 404, 406 with associated valves, vents, and/or baffles 408, 410 to direct cooling liquid through cooling pipes 118.

Figure 5:
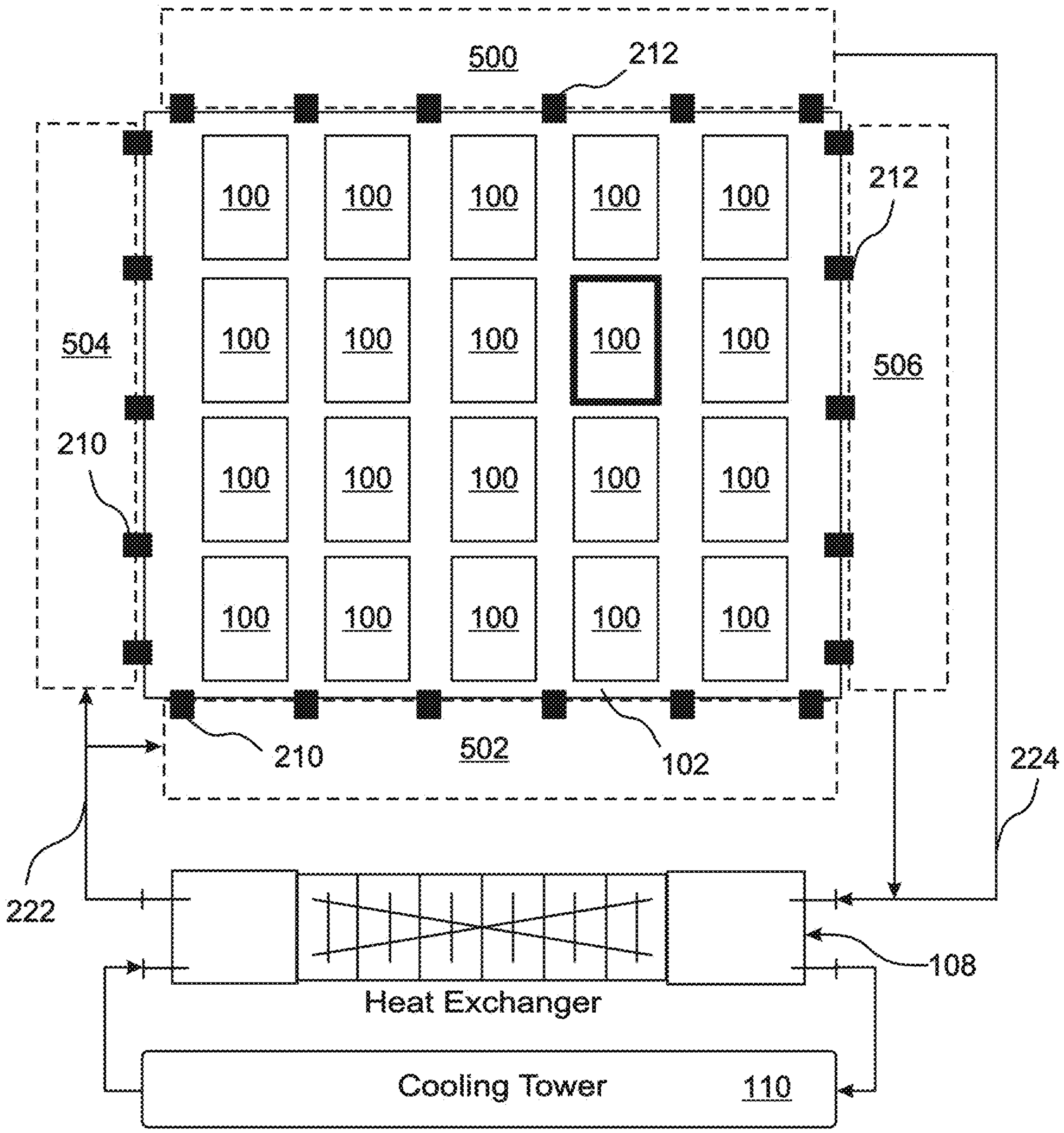
FIG. 5 is a top view of an embodiment of the present invention that comprises two opposing pairs of active inlet and outlet manifolds arranged on all four sides of the immersion tank.

FIG. 5 is a top view of an immersion cooling embodiment in which a single immersion tank 102 is provided with active manifolds 500, 502, 504, 506 on all four sides, arranged in two orthogonal opposing pairs of active inlet manifolds 500, 504 and active outlet manifolds 502, 506. The controller 204 has been omitted from the figure so that other features can be more easily seen. In the illustrated embodiment, the immersion tank 102 contains 20 electronic devices 100, arranged in an array of four horizontal rows and five horizontal columns. Similar embodiments provide an electronic device cabinet 120 with active manifolds 500, 502, 504, 506 on all four sides arranged in two orthogonal opposing pairs of active inlet manifolds 500, 504 and active outlet manifolds 502, 506.

By providing two orthogonal pairs of opposing active manifolds 500, 502, 504, 506, the controller 204 is able to maximize the flow of the cooling liquid to any of the electronic devices 100 that is operating as a hotspot. In the illustrated embodiment, the electronic device 100 in the second row and fourth column is shown with a heavy outline, indicating that it is currently a hotspot. In response, the controller 204 will cause the active manifolds 500, 502 to direct a higher percentage of cooling liquid through the fourth column, and will cause the orthogonal pair of active manifolds 504, 506 to direct a higher percentage of cooling liquid through the second row.

Figure 6:
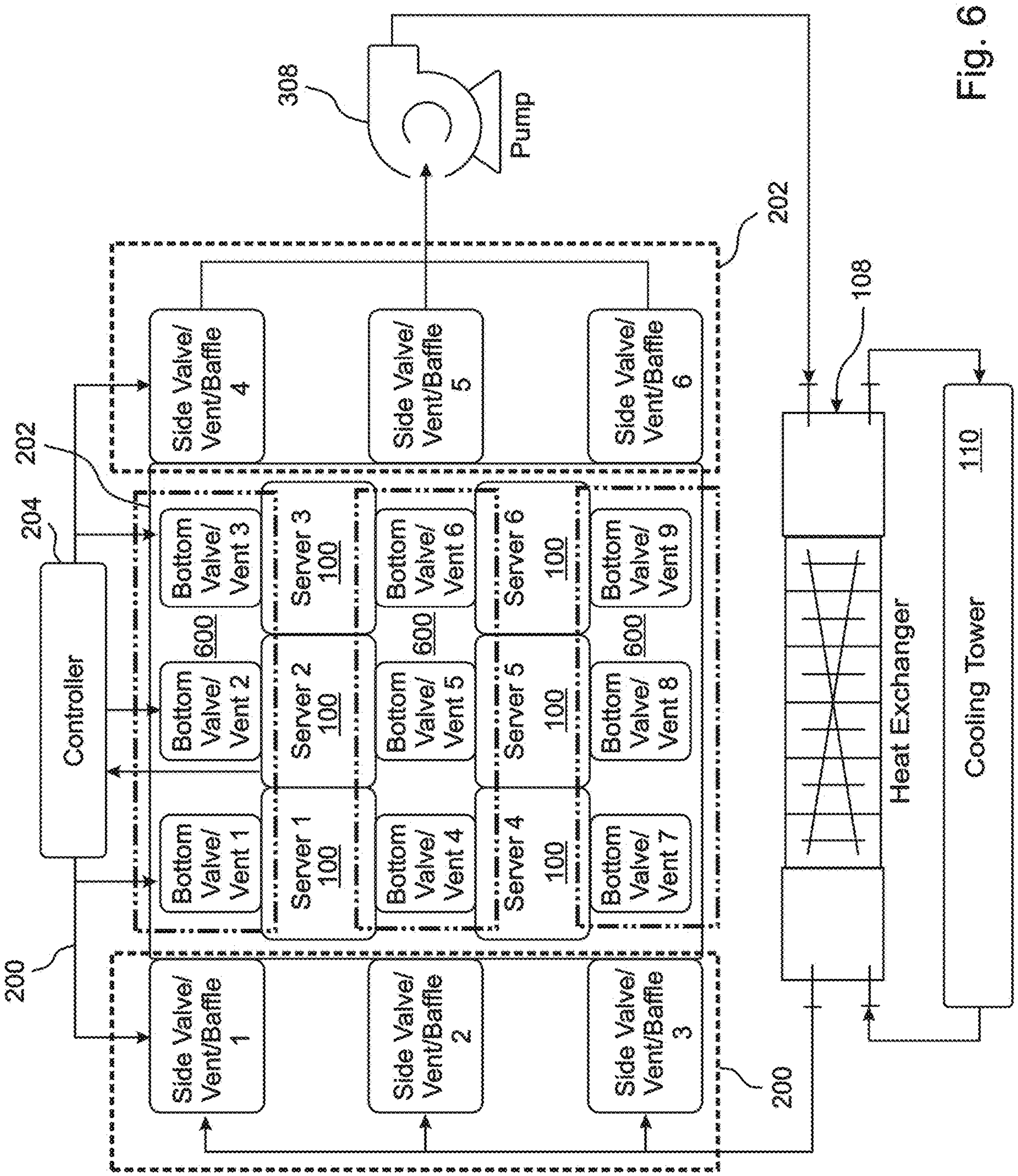
FIG. 6 is a bottom view of an embodiment of the present invention that includes active manifolds on the bottom of the immersion tank.

With reference to the bottom view of FIG. 6, in various embodiments, for example when the electronic devices 100 are arranged in vertically offset tiers, at least one active manifold 600 is located at the bottom of the electronic device cabinet 120 or immersion tank 102. In the illustrated embodiment, three active manifolds 600 are located at the bottom of an immersion tank 102.

Some embodiments provide an opposing active manifold at the top of the device array cabinet 120 or immersion tank 102. However, this can be problematic in the case of an immersion tank 102, in that the level of the cooling liquid at the top of the tank may vary, and the margin of cooling liquid above the electronic devices 100 may be small. Instead, in the embodiment of FIG. 6, the cooling liquid that is introduced by the bottom active manifolds 600 is drawn out of the immersion tank 102 through the active outlet manifold 202 that is located on the side of the immersion tank 102, together with the cooling liquid that is introduced from the opposing side horizontal active inlet manifold 200. According to this approach, in embodiments, the active outlet manifold 202 has a sufficient liquid flow capacity to receive all of the cooling liquid that is introduced into the immersion tank 102 by both the side inlet active manifold 200 and the bottom active manifolds 600.

Figure 7:
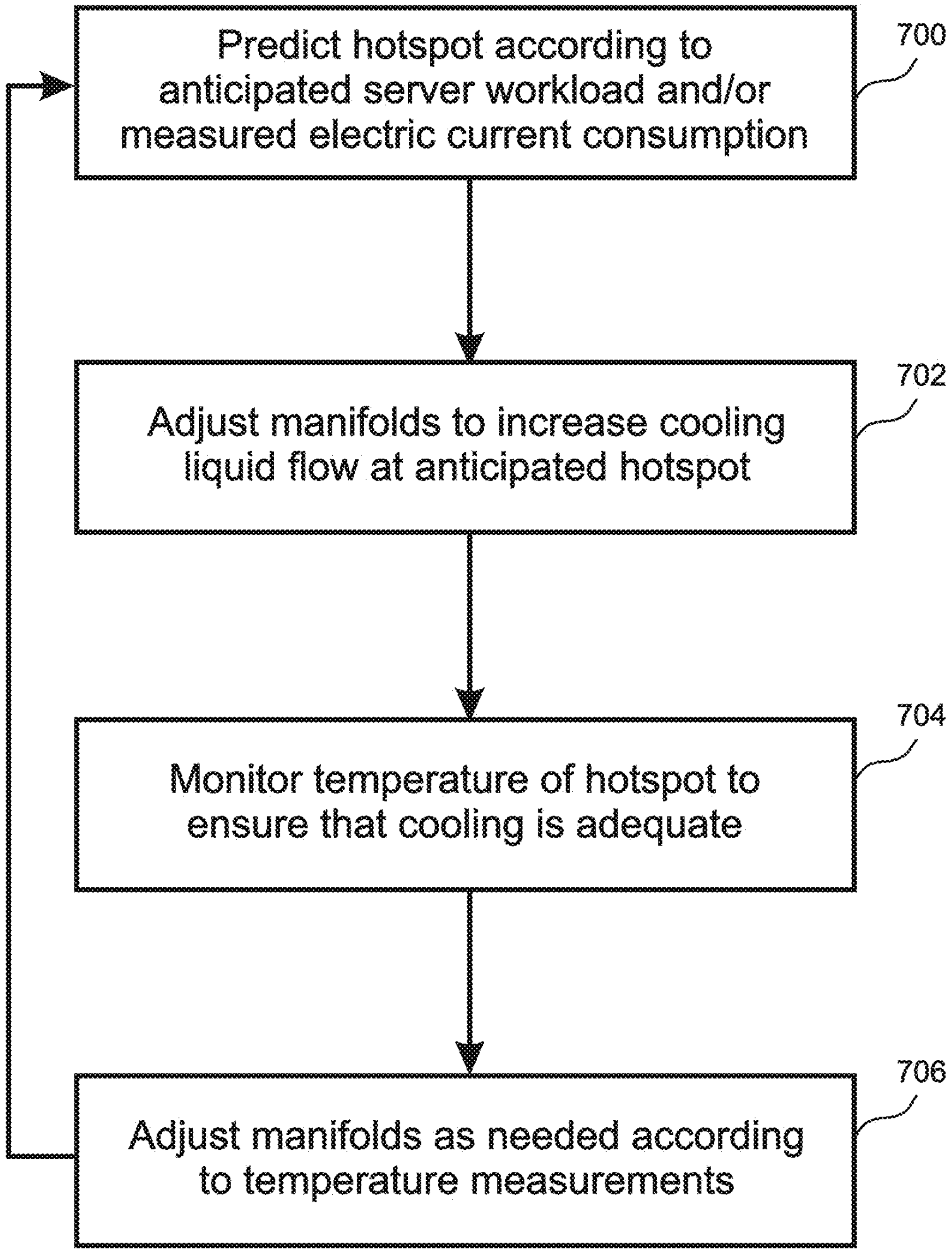
FIG. 7 is a flow diagram that illustrates a method embodiment of the present invention.

FIG. 7 illustrates a method embodiment of the present invention that implements predictive control of the active manifolds 200, 202. According to the disclosed embodiment, a future appearance of a hotspot is predicted 700 by the controller according to workloads that are scheduled to be assigned to the electronic devices 100, and/or measurements of current flows to the electronic devices 100, as described above. Based on this prediction, the controller adjusts 702 the active manifolds 200, 202 to increase the flow of the cooling liquid to the anticipated hotspot. In the illustrated embodiment, the controller also receives input from a sensor that monitors 704 the temperature at the hotspot location, to ensure that the cooling is adequate, and to adjusts 706 the cooling flow still further if needed.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the disclosure is not limited to just these forms, but is amenable to various changes and modifications. The present application does not explicitly recite all possible combinations of features that fall within the scope of the disclosure. The features disclosed herein for the various embodiments can generally be interchanged and combined into any combinations that are not self-contradictory without departing from the scope of the disclosure. In particular, the limitations presented in dependent claims below can be combined with their corresponding independent claims in any number and in any order without departing from the scope of this disclosure, unless the dependent claims are logically incompatible with each other.

What is claimed is:

1. A cooling system configured to cool a plurality of electronic devices enclosed within an immersion tank, the cooling system comprising:

a controller;

an active inlet manifold comprising a plurality of spaced apart manifold outlets through which a cooling liquid can flow into the immersion tank in proximity and thermal communication with the electronic devices, wherein the cooling liquid fills and flows through the immersion tank in direct physical contact with the electronic devices; and an active outlet manifold comprising a plurality of spaced apart manifold inlets through which the cooling liquid can flow from the immersion tank into the active outlet manifold;

wherein the active inlet manifold includes a first plurality of remotely adjustable flow control devices that separately control the flow of the cooling liquid through each of the plurality of manifold outlets, and the active outlet manifold includes a second plurality of remotely adjustable flow control devices that separately control the flow of the cooling liquid through each of the plurality of manifold inlets; and wherein the controller is configured to:

at least one of detect and predict a local heat dissipation increase in a hotspot region of the electronic devices; and adjust the flow control devices of the active manifolds to cause more of the cooling liquid to flow in thermal communication with the hotspot region as compared to other regions proximate the electronic devices.

2. The cooling system of claim 1, wherein at least one of the first and second pluralities of remotely adjustable flow control devices is a variable speed pump.

3. The cooling system of claim 2, wherein the variable speed pump is an intelligent rotary pump that is configured to maintain a controller specified flow rate of the cooling liquid therethrough.

4. The cooling system of claim 1, wherein at least one of the first and second pluralities of adjustable flow control devices is a remotely adjustable valve, vent, or baffle.

5. The cooling system of claim 1, wherein at least one of the inlet active manifold and the outlet active manifold comprises a variable speed pump and a remotely adjustable valve, vent, or baffle.

6. The cooling system of claim 1, wherein:

the active inlet manifold is a first active inlet manifold;

the active outlet manifold is a first active outlet manifold;

the first active inlet and outlet manifolds are arranged on opposing first and second sides of the electronic devices, and are configured to direct the cooling liquid in a first horizontal direction past the electronic devices; and the cooling system further comprises a second active inlet manifold and a second active outlet manifold, the second active inlet and outlet manifolds being located on opposing third and fourth sides of the electronic devices and configured to direct the cooling liquid in a second horizontal direction past the electronic devices, the second horizontal direction being orthogonal to the first horizontal direction.

7. The cooling system of claim 1, further comprising at least one of a third active inlet manifold located below the electronic devices and a third active outlet manifold located below the electronic devices.

8. The cooling system of claim 1, wherein the controller is configured to receive a temperature measurement from a first temperature sensor proximate the electronic devices.

9. The cooling system of claim 8, wherein the first temperature sensor is integral to a first electronic component of the plurality of electronic devices, and is configured to measure an internal temperature of the first electronic component.

10. The cooling system of claim 1, wherein the controller is configured to predict the local heat dissipation increase in the hotspot region of the immersion tank in advance of a temperature increase therein.

11. The cooling system of claim 10, wherein the controller is configured to predict the local heat dissipation increase in the hotspot region of the immersion tank at least in part according to a measurement of an electrical status of a first electronic component of the plurality of electronic devices, the electrical status being at least one of:

an amount of current flowing through the first electronic component;

an electrical voltage applied to the first electronic component; and an amount of electrical power flowing to the first electronic component.

12. The cooling system of claim 10, wherein the controller is configured to predict the local heat dissipation increase in the hotspot region of the immersion tank at least in part according to a workload prediction that is applicable to a first electronic device.

13. The cooling system of claim 12, wherein the workload prediction is inferred from information regarding network activity, and/or information derived from an internal server scheduler that queues tasks to be performed by the first electronic device.

14. The cooling system of claim 1, wherein the plurality of electronic devices are arranged in at least one of a plurality of horizontal rows, a plurality of horizontal columns, and a plurality of vertical tiers.

15. A method of cooling a plurality of electronic devices enclosed within an immersion tank, the method comprising:

providing a cooling system comprising:

a controller;

an active inlet manifold comprising a plurality of spaced apart outlets through which a cooling liquid can flow into the immersion tank in proximity and thermal communication with the electronic devices, wherein the cooling liquid fills and flows through the immersion tank in direct physical contact with the electronic devices; and an active outlet manifold comprising a plurality of spaced apart inlets through which the cooling liquid can flow from the immersion tank into the active outlet manifold; and wherein the active inlet manifold includes a first plurality of remotely adjustable flow control devices that separately control the flow of the cooling liquid through each of the plurality of outlets, and the active outlet manifold includes a second plurality of remotely adjustable flow control devices that separately control the flow of the cooling liquid through each of the plurality of inlets;

at least one of detecting and predicting a local heat dissipation increase in a hotspot region of the electronic devices; and adjusting, by the controller, the flow control devices of the active manifolds to cause more of the cooling liquid to flow in thermal communication with the hotspot region as compared to other regions proximate the electronic devices.

16. The method of claim 15, wherein predicting the local heat dissipation increase in the hotspot region comprises receiving a measurement of an electrical status of a first electronic component of the plurality of electronic devices, the electrical status being at least one of:

an amount of current flowing through the first electronic component;

an electrical voltage applied to the first electronic component; and an amount of electrical power flowing to the first electronic component.

17. The method of claim 15, wherein predicting the local heat dissipation increase in the hotspot region of the immersion tank comprises receiving a workload prediction applicable to a first electronic component of the plurality of electronic devices.

18. The method of claim 17, wherein receiving the workload prediction comprises inferring an anticipated workload applicable to the first electronic component from information regarding network activity, and/or information derived from an internal server scheduler that queues tasks to be performed by the electronic devices.

* * * * *